US007466126B2

(12) United States Patent
Kliman et al.

(10) Patent No.: US 7,466,126 B2

(45) Date of Patent: Dec. 16, 2008

(54) UNIVERSAL SENSOR PROBE WITH ADJUSTABLE MEMBERS CONFIGURED TO FIT BETWEEN A PLURALITY OF SLOT OPENINGS OF VARYING WIDTHS

(75) Inventors: Gerald Burt Kliman, deceased, late of Niskayuna NY (US); by Edith Kliman, legal representative, Niskayuna, NY (US); Ralph James Carl, Jr., Clifton Park, NY (US); Manoj Ramprasad Shah, Latham, NY (US); Sang-Bin Lee, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 956 days.

(21) Appl. No.: 10/889,619

(22) Filed: Jul. 12, 2004

(65) Prior Publication Data

US 2006/0006848 A1 Jan. 12, 2006

(51) Int. Cl.
*G01R 27/82* (2006.01)

(52) U.S. Cl. ........................ 324/219; 324/239; 324/237

(58) Field of Classification Search ................................ 324/207.15–207.17, 219, 228, 234, 236–241, 324/529, 772; 318/490

See application file for complete search history.

(56) References Cited

U.S. PATENT DOCUMENTS

| | | | |
|---|---|---|---|
| 4,996,486 A | 2/1991 | Posedel | |
| 5,341,095 A | 8/1994 | Shelton et al. | |
| 5,990,688 A | 11/1999 | Bourgeois et al. | |
| 6,469,504 B1 | 10/2002 | Kliman et al. | |
| 6,847,224 B2 * | 1/2005 | Lee et al. | 324/772 |
| 6,927,598 B2 * | 8/2005 | Lee et al. | 324/772 |

FOREIGN PATENT DOCUMENTS

| | | |
|---|---|---|
| GB | 2044936 | 8/1979 |
| RU | 2082274 CI | 8/1994 |

OTHER PUBLICATIONS

The European Search Report Dated Jan. 20, 2005 is Enclosed.

(Continued)

*Primary Examiner*—Jay M Patidar

(74) *Attorney, Agent, or Firm*—Ann M. Agosti

(57) ABSTRACT

An aspect of the invention is directed to a variable sensor head for use in multiple electric machines with varying slot openings comprising a ferromagnetic core; a first adjustable portion and a second adjustable portion positioned in communication with the ferromagnetic core wherein the first adjustable portion and the second adjustable portion are adjusted to fit between a plurality of slot openings of varying widths between a pair of lamination teeth of an electric machine. According to another embodiment, the first and second adjustable portions are sliding portions where the sliding portions may be spring biased to provide a close fit between the pair of lamination teeth. According to another embodiment, the first and second adjustable portions are adjustable screws. According to another embodiment, the first adjustable portion is a plurality of nested steel sheets providing a spring biased tension and the second adjustable portion is in communication with the plurality of nested steel sheets for contacting one of the pair of lamination teeth. According to another embodiment, a ferromagnetic core comprises an adjustable portion including a plurality of corrugated laminations creating a plurality of nested wavy springs.

19 Claims, 2 Drawing Sheets

OTHER PUBLICATIONS

Sang Bin Lee, et al, "An Iron Core Probe Based Inter-Laminar Core Fault Detection Technique for Generator Stator Cores", *Proceedings of IEEE PES* (*Power Engineering Society*) *General Meeting*), vol. 3, pp. 1880-1887, Toronto, ON, Canada, Jul. 2003.

* cited by examiner

UNIVERSAL SENSOR PROBE WITH ADJUSTABLE MEMBERS CONFIGURED TO FIT BETWEEN A PLURALITY OF SLOT OPENINGS OF VARYING WIDTHS

BACKGROUND OF THE INVENTION

This invention relates generally to sensor probes and, more particularly, to a universal magnetic sensor probe for use in the slot of an electrical machine wherein the probe includes adjustable members for use in a variety of electrical machines with different slot openings.

In the field of generating and utilizing electricity, it is important that elements of an electrical machine system remain fully functional over their expected working life so that unexpected downtimes and/or catastrophic failures can be avoided. To avoid such problems, it is important that elements such as large stators, which form part of the electrical machine systems are carefully inspected and tested during regular periodic maintenance or before being sold and installed, in particular, prior to electric power generating installation.

The stator core of electric machines utilizes thin insulated steel laminations to enable flux penetration and to reduce the eddy current flow for higher efficiency operation. The laminations are often stacked by placing a dovetail groove of the laminations in a dovetail of a key bar, which is attached to the frame. To hold the laminations together and to prevent lamination vibration, the core is axially clamped with a force of about 300~350 pound per square in (psi) (2.07 megapascal (MPa)~2.41 MPa).

Short circuiting one lamination to another lamination can be caused by manufacturing defects, damage during assembly/inspection/rewind, stator-rotor contact, vibration of loose coil wedges/laminations, foreign magnetic material, etc. If the laminations are short circuited for any reason, a circulating fault current is induced. The circulating fault current increases with the number of shorted laminations and the conductivity between the laminations and the short/key bar. The fault current increases the power dissipation in the stator core and causes localized heating. The hot spots can progress to more severe localized heating and eventually cause burning or melting of the laminations. As a result, the stator bar insulation and windings can also be damaged causing ground current flow through the stator core and total destruction of the machines. Therefore, inter-laminar faults should be detected and repaired while damage is minor to prevent escalating damage and to improve the reliability of electric machine operation. Such faults may be detected by a sensor probe positioned within a slot opening of an electrical machine where variations in leakage flux produced with the stator suitably energized may be monitored.

Electric machines (e.g., generators, motors, etc.) of different designs will invariably have different widths of slot openings. In particular, different manufacturers provide electric machines having lamination teeth in varying sizes. Further, slot openings between the lamination teeth are also of different widths and sizes. As a result, a set of as many as 12-15 different sensor probes may be required to accommodate the varying slot openings of electric machines. There may be some instances where an exact fit or a desired air gap cannot be achieved by the pre-fabricated sensor probes. Therefore, inefficiencies such as higher manufacturing costs and increased efforts will result.

These and other drawbacks exist in current systems and techniques.

BRIEF DESCRIPTION OF THE INVENTION

In accordance with an exemplary embodiment of the invention, a variable sensor head for use in multiple electric machines with varying slot openings comprises a ferromagnetic core; and a first adjustable portion and a second adjustable portion positioned in communication with the ferromagnetic core wherein the first adjustable portion and the second adjustable portion are adjusted to fit between a plurality of slot openings of varying widths between a pair of teeth of an electric machine.

In accordance with other aspects of this particular exemplary embodiment of the invention, the first and second adjustable portions are sliding portions; the sliding portions are spring biased to provide a close fit between the pair of teeth which are lamination teeth; a surface of each of the sliding portions in contact with the pair of lamination teeth are coated with a slippery plastic material; a surface of each of the sliding portions in contact with the pair of lamination teeth are coated with one or more of iron powder and ferromagnetic fluid to reduce an effective air gap; the first and second adjustable portions are adjustable screws and the pair of teeth are lamination teeth; a surface of each of the adjustable screws in contact with the pair of lamination teeth are coated with a slippery plastic material; a surface of each of the adjustable screws in contact with the pair of lamination teeth are coated with iron powder to reduce an effective air gap; a surface of each of the adjustable screws in contact with the pair of lamination teeth are coated with a ferromagnetic fluid to reduce an effective air gap; the first and second adjustable portions are made of magnetic material; the magnetic material comprises one or more of laminations and soft magnetic composite; the first adjustable portion is a plurality of nested steel sheets providing a spring biased tension; the second adjustable portion is in communication with the plurality of nested steel sheets for contacting one of the pair of teeth; sensitivity in the ability to detect a change in flux pattern is increased by reducing air gap between the core and the pair of teeth, which are lamination teeth; and the core, first adjustable portion and the second adjustable portion comprise a magnetic material for effective flux transfer.

In accordance with another exemplary embodiment of the invention, a variable sensor head for use in multiple electric machines with varying slot openings comprises a ferromagnetic core; and an adjustable portion positioned in communication with the ferromagnetic core wherein the adjustable portion is adjusted to fit between a plurality of slot openings of varying widths between a pair of teeth of an electric machine.

In accordance with another exemplary embodiment of the invention, a variable sensor head for use in multiple electric machines with varying slot openings comprises a ferromagnetic core comprising an adjustable portion wherein the adjustable portion is adjusted to fit between a plurality of slot openings of varying widths between a pair of teeth of an electric machine; and a coil surrounding the ferromagnetic core. In accordance with other aspects of this particular exemplary embodiment of the invention, the adjustable portion comprises a plurality of corrugated laminations creating a plurality of nested steel sheet bellows; the plurality of corrugated laminations comprise a ferromagnetic material; and the nested steel sheet bellows are spring biased.

Aspects of the invention will now be described in more detail with reference to exemplary embodiments thereof as shown in the appended drawings. While the invention is described below with reference to preferred embodiments, it should be understood that the invention is not limited thereto.

Those skilled in the art having access to the teachings herein will recognize additional implementations, modifications, and embodiments, as well as other fields of use, which are within the scope of the invention as disclosed and claimed herein, and with respect to which the invention could be of significant utility.

BRIEF DESCRIPTION OF THE DRAWINGS

In order to facilitate a fuller understanding of the inventions, reference is now made to the appended drawings. These drawings should not be construed as limiting the inventions, but are intended to be exemplary only.

DETAILED DESCRIPTION OF EXEMPLARY EMBODIMENTS

An aspect of the invention is directed to a universal sensor having a ferromagnetic core including adjustable portions to fit various slot openings while maintaining a low magnetic reluctance and a secure mount for the coil. Another aspect of the invention is directed to incorporating sliding members. The sliding members may also include a spring bias for a close fit. Another aspect of the invention is directed to incorporating screw portions that may be adjusted to fit various slot openings. Another aspect of the invention is directed to a variable sensor head incorporating a series of corrugated laminations. Another aspect of the invention is directed to incorporating a series of sheet bellows between a core and an adjustable portion.

In brief, an embodiment of the invention may include a sensor or probe which includes a ferromagnetic core and a coil surrounding the core. The core may be disposed between opposed surfaces of a device. These surfaces may be the side walls of adjacent lamination teeth of a stator. The embodiments of the invention may be applied to different devices and/or applications.

The use of a sensor or probe having a core formed of a magnetic material provides a significant increase in the signal level as the sensor or probe provides a low magnetic reluctance path for the flux. The measured probe voltage may be approximately 2~3 orders of magnitude higher than that of an air core probe due in part to a high flux concentration in the probe. As a result, signal to noise ratio of the voltage measurement is improved. The sensor or probe may be disposed in a wedge depression area of a slot with a total air gap of up to 200 mils, for example, on either side of the probe.

According to another embodiment of the invention, the ferromagnetic core of the sensor head includes adjustable members to fit various slot openings while maintaining a low magnetic reluctance and a secure mount for the coil. The ferromagnetic core may be made variable to accommodate different slot openings. The core may be adjusted for no air gap and/or to maintain a predetermined air gap on either side. An embodiment of the invention is directed to an adjustable sensor head to fit a wide range of slot openings of varying width or size.

Figure 1:
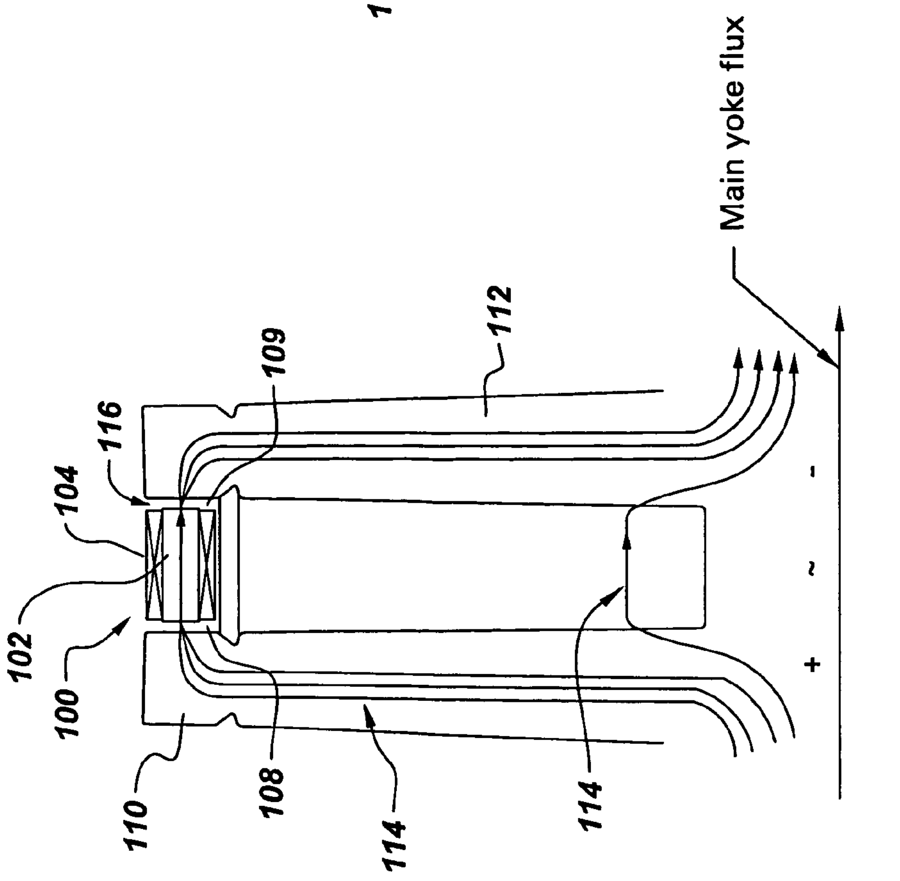
FIG. 1 is a schematic front view showing the deployment of a probe or sensor depicting the leakage flux which occurs in the absence of a fault.

FIG. 1 is a schematic front view showing the deployment of a probe or sensor depicting the leakage flux which occurs in the absence of a fault. As shown in FIG. 1, sensor 100 is a fixed sensor head which includes a ferromagnetic core 102 and a coil 104 surrounding the core 102. Sensor 100 may be positioned in a wedge depression area 116. The coil 104 may be connected with a circuit arrangement. The core 102 may be located with respect to the laminated teeth 110, 112 so that air gaps 108, 109 are defined between the opposed surfaces of the adjacent teeth between which the sensor 100 is disposed, and the respective ends of the core 102. A laminated or molded (e.g., soft magnetic composite "SMC") ferromagnetic core 102 may be set between teeth 110 and 112. The fixed sensor head may also be used as an injection head or probe. For example, in accordance with one embodiment of the invention, a method for detecting core faults comprises (a) positioning a magnetic yoke near at least one tooth of the core, the magnetic yoke being wound by a winding; (b) supplying current to the winding to inject magnetic flux into the at least one tooth of the core; (c) measuring a signal (meaning at least one signal) resulting from the injected magnetic flux; and (d) using the measured signal to detect core faults. Sensor or probe 100 may be used to detect a change in flux pattern 114.

Figure 2:
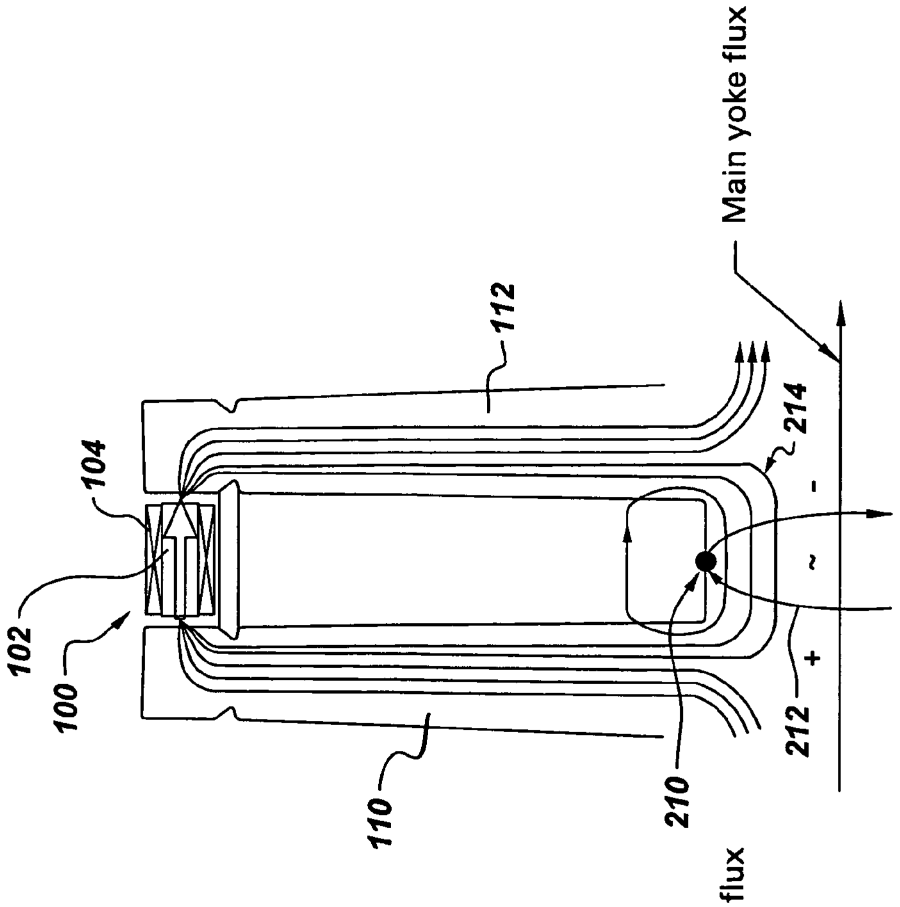
FIG. 2 is a schematic front view similar to that shown in FIG. 1, depicting a situation where a fault has occurred and the leakage flux has changed accordingly.

FIG. 2 is a schematic front view similar to that shown in FIG. 1, depicting a situation where a fault has occurred and the leakage flux has changed accordingly. As shown in this illustration, under fault conditions 210, the sensor 100 actively provides a path for resultant leakage flux due to fault current 212, as shown by 214. Further, flux level may be increased by several orders of magnitude.

According to an embodiment of the invention, sensor 100 may be more sensitive to a change in flux patterns as the air gaps between the sensor 100 and the lamination teeth 110, 112 are reduced. Therefore, the adjustable sensor of an embodiment of the invention may effectively reduce the air gap between the sensor 100 and the lamination teeth thereby increasing the sensitivity and ability to detect changes, such as changes in flux patterns. In addition, the adjustable sensor of an embodiment of the invention may be used with various electric machines of varying slot openings thereby promoting measurement efficiency. In another example, the adjustable sensor may be implemented to maintain a predetermined or specified air gap between the sensor 100 and lamination teeth 110, 112. Therefore, a single sensor may be used to fit a plurality of electric machines with different slot openings.

Figure 3:
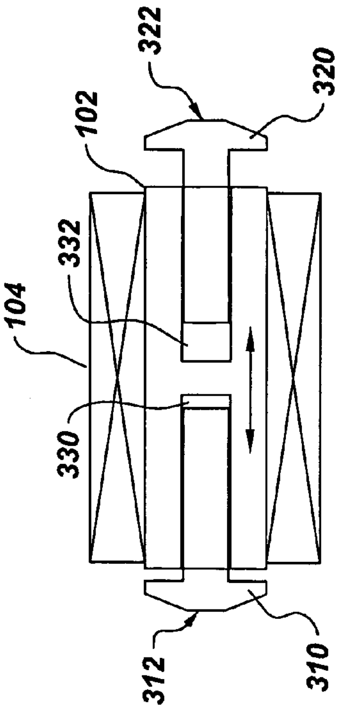
FIG. 3 is an example of an adjustable sensor with sliding members in accordance with an embodiment of the invention.

FIG. 3 is an example of an adjustable sensor with sliding members in accordance with an embodiment of the invention. In particular, FIG. 3 illustrates an adjustable probe with sliding members 310, 320 to fit in slot openings of varying width or size. According to another variation of an embodiment of the invention, a single sliding member may be used in place of multiple sliding members 310, 320. More specifically, a single sliding member may be formed by combining the ends at 330 and 332. The ferromagnetic core sensor 102 may be made adjustable by sliding members 310, 320 at either end. For example, some or all the parts may be made of a magnetic material, which may be laminated or molded, and fit closely together for effective flux transfer at any position. The sliding members 310, 320 may be adjusted for a desired fit. In another example, springs may be added at the back of the moving parts (e.g., sliding members 310, 320) at 330, 332 to hold the sensor active surfaces 312, 322 tightly against the lamination teeth to achieve maximum sensitivity. In this example, surfaces 312, 322 may be coated with a slippery plastic material and further loaded with a metallic powder (e.g., iron powder) to maintain permeability and reduce an effective air gap thereby enabling surfaces 312, 322 to slide on the laminations without damage. In another example, a ferromagnetic fluid may be used to reduce the effective air gap.

By reducing the air gap between the sensor and the lamination teeth, flux transfer may be enhanced. For example, as the change in geometry is minimal, the magnetic flux enters through one end, is collected in the core and moves through to the other end with low magnetic reluctance. Further, the reluctance of the path of the magnetic flux is minimal as compared to a path with air gaps.

Figure 4:
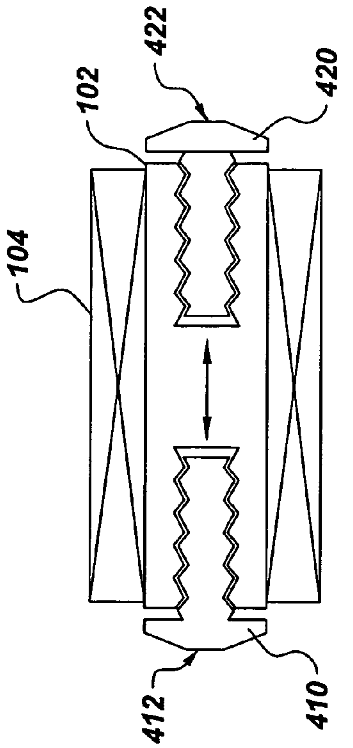
FIG. 4 is an example of an adjustable sensor with screw portions in accordance with an embodiment of the invention.

FIG. 4 is an example of an adjustable sensor with screw portions in accordance with an embodiment of the invention. FIG. 4 illustrates an adjustable probe with screw portions 410, 420. The screw portions 410, 420 may be made of molded, powdered metal (e.g., soft magnetic composite) with screw threads for adjustability. The screw portions 410, 420 may be adjusted to fit a desired slot opening. In addition, surfaces 412, 422 may be coated with a slippery plastic material and further loaded with a metallic powder (e.g., iron powder) to reduce an effective air gap thereby enabling surfaces 412, 422 to slide on the laminations without damage. In another example, a ferromagnetic fluid may be used to reduce the effective air gap.

Figure 5:
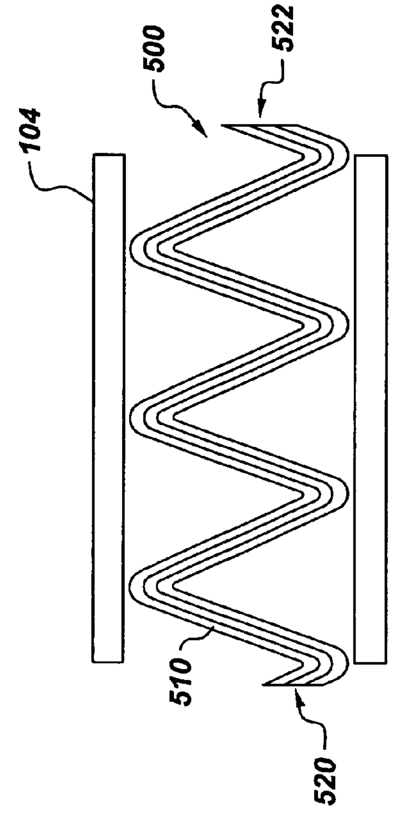
FIG. 5 is an example of a corrugated lamination variable sensor in accordance with an embodiment of the invention.

FIG. 5 is an example of a corrugated lamination variable sensor head in accordance with an embodiment of the invention. In this embodiment, a ferromagnetic core 102 may be formed as (or include) corrugated laminations 500. surrounded by coil 104. Corrugated laminations 500 may be nested, wavy springs for holding the surfaces 520, 522 of the ferromagnetic core against the lamination teeth for minimizing gaps between the core and the lamination teeth. In this illustration, corrugated laminations 500 may include a plurality of sheets where 510 represents a single sheet. The corrugated laminations 500 may provide a spring biased effect to fit closely between slots of varying width or size. Further, each sheet 510 of the corrugated laminations 510 may be made of metallic material.

Figure 6:
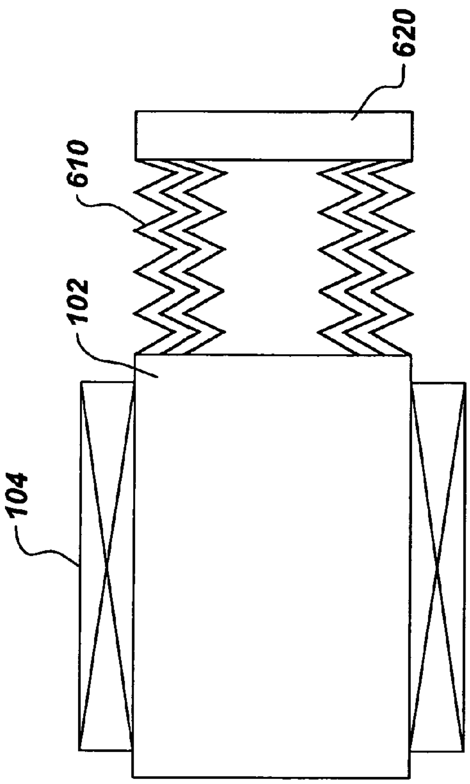
FIG. 6 is an example of a variable sensor with steel sheet bellows in accordance with an embodiment of the invention.

FIG. 6 is an example of a variable sensor with a steel sheet bellows in accordance with an embodiment of the invention. Flux may be conducted through a series of nested bellows 610 that may also serve to spring load one of the sides of the sensor so that the sensor surface makes uniform contact with a wall of the lamination tooth. In this example, core 102 may include soft magnetic composite or laminated core. Other types of magnetic material may be used. Core 102 may be surrounded by coil 104. Nested steel sheet bellows 610 may connect to a side of core 102 and a member 620 where the nested steel sheet bellows 610 provides a spring biased tension to form a close fit between lamination teeth. Member 620 may be made of a similar magnetic material as core 102, or other metallic materials may be used.

Other magnetic materials may also include powered iron in a plastic binder, ceramic ferrite, iron wire bundle, and other equivalent materials.

The inventions are not to be limited in scope by the specific embodiments described herein. Indeed, various modifications of the inventions, in addition to those described herein, will be apparent to those of ordinary skill in the art from the foregoing description and accompanying drawings. Thus, such modifications are intended to fall within the scope of the following appended claims. Further, although the inventions have been described herein in the context of a particular implementation in a particular environment for a particular purpose, those of ordinary skill in the art will recognize that its usefulness is not limited thereto and that the inventions can be beneficially implemented in any number of environments for any number of purposes. Accordingly, the claims set forth below should be construed in view of the full breath and spirit of the inventions as disclosed herein.

The invention claimed is:

1. A variable sensor head for use in multiple electric machines with varying slot openings, the variable sensor head comprising:

a ferromagnetic core; and a first adjustable portion and a second adjustable portion positioned in communication with the ferromagnetic core wherein the first adjustable portion and the second adjustable portion are adjusted to fit between a plurality of slot openings of varying widths between a pair of teeth of an electric machine.

2. The variable sensor head of claim 1, wherein the first and second adjustable portions are sliding portions.

3. The variable sensor head of claim 2, wherein the sliding portions are spring biased to provide a close fit between the pair of teeth which are lamination teeth.

4. The variable sensor head of claim 3, wherein a surface of each of the sliding portions in contact with the pair of lamination teeth are coated with a slippery plastic material.

5. The variable sensor head of claim 3, wherein a surface of each of the sliding portions in contact with the pair of lamination teeth are coated with one or more of iron powder and ferromagnetic fluid to reduce an effective air gap.

6. The variable sensor head of claim 1, wherein the first and second adjustable portions are adjustable screws and the pair of teeth are lamination teeth.

7. The variable sensor head of claim 6, wherein a surface of each of the adjustable screws in contact with the pair of lamination teeth are coated with a slippery plastic material.

8. The variable sensor head of claim 6, wherein a surface of each of the adjustable screws in contact with the pair of lamination teeth are coated with iron powder to reduce an effective air gap.

9. The variable sensor head of claim 6, wherein a surface of each of the adjustable screws in contact with the pair of lamination teeth are coated with a ferromagnetic fluid to reduce an effective air gap.

10. The variable sensor head of claim 1, wherein the first and second adjustable portions are made of magnetic material.

11. The variable sensor head of claim 10, wherein the magnetic material comprises one or more of laminations and soft magnetic composite.

12. The variable sensor head of claim 1, wherein the first adjustable portion is a plurality of nested steel sheets providing a spring biased tension.

13. The variable sensor head of claim 12, wherein the second adjustable portion is in communication with the plurality of nested steel sheets for contacting one of the pair of teeth, wherein the pair of teeth are lamination teeth.

14. The variable sensor head of claim 1, wherein the core, first adjustable portion and the second adjustable portion comprise a magnetic material for effective flux transfer.

15. A variable sensor head for use in multiple electric machines with varying slot openings, the variable sensor head comprising:

a ferromagnetic core; and an adjustable portion positioned in communication with the ferromagnetic core wherein the adjustable portion is adjusted to fit between a plurality of slot openings of varying widths between a pair of teeth of an electric machine.

16. A variable sensor head for use in multiple electric machines with varying slot openings, the variable sensor head comprising:

a ferromagnetic core comprising an adjustable portion wherein the adjustable portion is adjusted to fit between a plurality of slot openings of varying widths between a pair of teeth of an electric machine; and a coil surrounding the ferromagnetic core.

17. The variable sensor head of claim 16, wherein the adjustable portion comprises a plurality of corrugated laminations creating a plurality of nested steel sheet bellows.

18. The variable sensor head of claim 17, wherein the plurality of corrugated laminations comprise a ferromagnetic material.

19. The variable sensor head of claim 17, wherein the plurality of nested steel sheet bellows are spring biased.

* * * * *